US012782413B2

(12) United States Patent
Yoshida

(10) Patent No.: US 12,782,413 B2
(45) Date of Patent: Nov. 3, 2026

(54) TEST JIG, TESTING METHOD, AND METHOD OF MANUFACTURING SEMICONDUCTOR DEVICE

(71) Applicant: FUJI ELECTRIC CO., LTD., Kawasaki (JP)

(72) Inventor: Mitsuru Yoshida, Shiojiri-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 145 days.

(21) Appl. No.: 18/900,012

(22) Filed: Sep. 27, 2024

(65) Prior Publication Data

US 2025/0155490 A1 May 15, 2025

(30) Foreign Application Priority Data

Nov. 15, 2023 (JP) ................................ 2023-194227

(51) Int. Cl.
*G01R 31/26* (2020.01)
*H10P 54/00* (2026.01)
*H10W 46/00* (2026.01)

(52) U.S. Cl.
CPC .......... *G01R 31/2601* (2013.01); *H10P 54/00* (2026.01); *H10W 46/00* (2026.01); *H10W 46/501* (2026.01)

(58) Field of Classification Search
None
See application file for complete search history.

(56) References Cited

U.S. PATENT DOCUMENTS 9,291,664 B2 * 3/2016 Gaggl ................ G01R 31/2642
2007/0247177 A1 * 10/2007 Ruckenbauer ..... G01R 31/2891
324/750.19

FOREIGN PATENT DOCUMENTS

AT 511058 B1 * 9/2012
AT 14209 U1 * 6/2015 ......... G01R 31/2601
CN 209746090 U * 12/2019
JP 3211220 U * 6/2017 ......... G01R 1/06777
WO WO-2015106302 A1 * 7/2015 ......... G01R 1/07314

OTHER PUBLICATIONS

"High Voltage—High Current Probe Cards for Power Semiconductors", T.I.P.S. Messtechnik GmbH. [online]. Internet URL: https://www.tips.co.at/pdfs_probecards/High-Voltage-High-Current-Probe-Cards.pdf.

* cited by examiner

*Primary Examiner* — Rodney E Fuller
(74) *Attorney, Agent, or Firm* — Rabin & Berdo, P.C.

(57) ABSTRACT

A test jig for testing a plurality of semiconductor devices formed on a wafer, including: a substrate having an opening extending therethrough in an up-down direction, to allow air to be injected from the opening during testing; a chamber formed to surround the opening, and being positioned lower than the substrate; and a first probe for measuring each semiconductor device, the first probe being connected to the substrate. The chamber includes: a surrounding member that surrounds the first probe, and is configured to float upward in response to the injection of the air from the opening during the testing; a support part configured to support the surrounding member before the surrounding member floats upward during the testing; and a restraining member configured to restrain the surrounding member from lowering such that the surrounding member does not contact the wafer after the injection of the air stops during the testing.

7 Claims, 13 Drawing Sheets

TEST JIG, TESTING METHOD, AND METHOD OF MANUFACTURING SEMICONDUCTOR DEVICE

CROSS-REFERENCE TO RELATED APPLICATIONS

The present application claims priority pursuant to 35 U.S.C. § 119 from Japanese patent application number 2023-194227 filed on Nov. 15, 2023, the entire disclosure of which is hereby incorporated by reference herein.

BACKGROUND

Technical Field

The present disclosure relates to a test jig, a testing method, and a method of manufacturing a semiconductor device.

Description of the Related Art

Semiconductor devices such as power Metal-Oxide-Semiconductor-Field-Effect-Transistors (MOSFETS), Insulated Gate Bipolar Transistors (IGBTs), and the like are subjected to a test in which a high voltage is applied (high-voltage testing) to be screened for defective products. As a jig for such high-voltage testing, a small chamber is provided under a probe card, and air is injected into the chamber to apply pressure, thereby suppressing discharge breakdown of adjacent chips (see, for example, U.S. Pat. No. 9,291,664, <https://www.tips.co.at/pdfs probecards/High-Voltage-High-Current-Probe-Cards.pdf>).

During high voltage testing, the bottom (lower end) of the chamber may contact a wafer, thereby causing damage to a wafer surface. Further, U.S. Pat. No. 9,291,664 discloses that a ring (movable part) is provided around the chamber, and air is injected into the chamber during testing to thereby float the ring upward. Even when the ring is provided and floated as such, the ring may lower and contact a wafer (may scratch a wafer surface), if the injection of air is stopped due to an abnormality, for example.

SUMMARY

An aspect of the present disclosure is a test jig to test each semiconductor device of a plurality of semiconductor devices formed on a wafer, the test jig comprising: when a thickness direction of the wafer during testing is defined as an up-down direction, where up is defined as a front surface side and down is defined as a back surface side, a substrate positioned above the wafer during the testing, the substrate having an opening extending therethrough in the up-down direction; a chamber provided on the lower side relative to the substrate, the chamber being formed so as to surround the opening; and a first probe for measuring the semiconductor device, the first probe being connected to the substrate, the chamber including a surrounding member that surrounds the first probe, the surrounding member being configured to float upward, in response to air being injected from the opening during the testing; a support part configured to support the surrounding member before the testing; and a restraining member configured to restrain the surrounding member from lowering such that the surrounding member does not contact the wafer when injection of air into the opening is stopped, during the testing.

DETAILED DESCRIPTION

Figure 1:
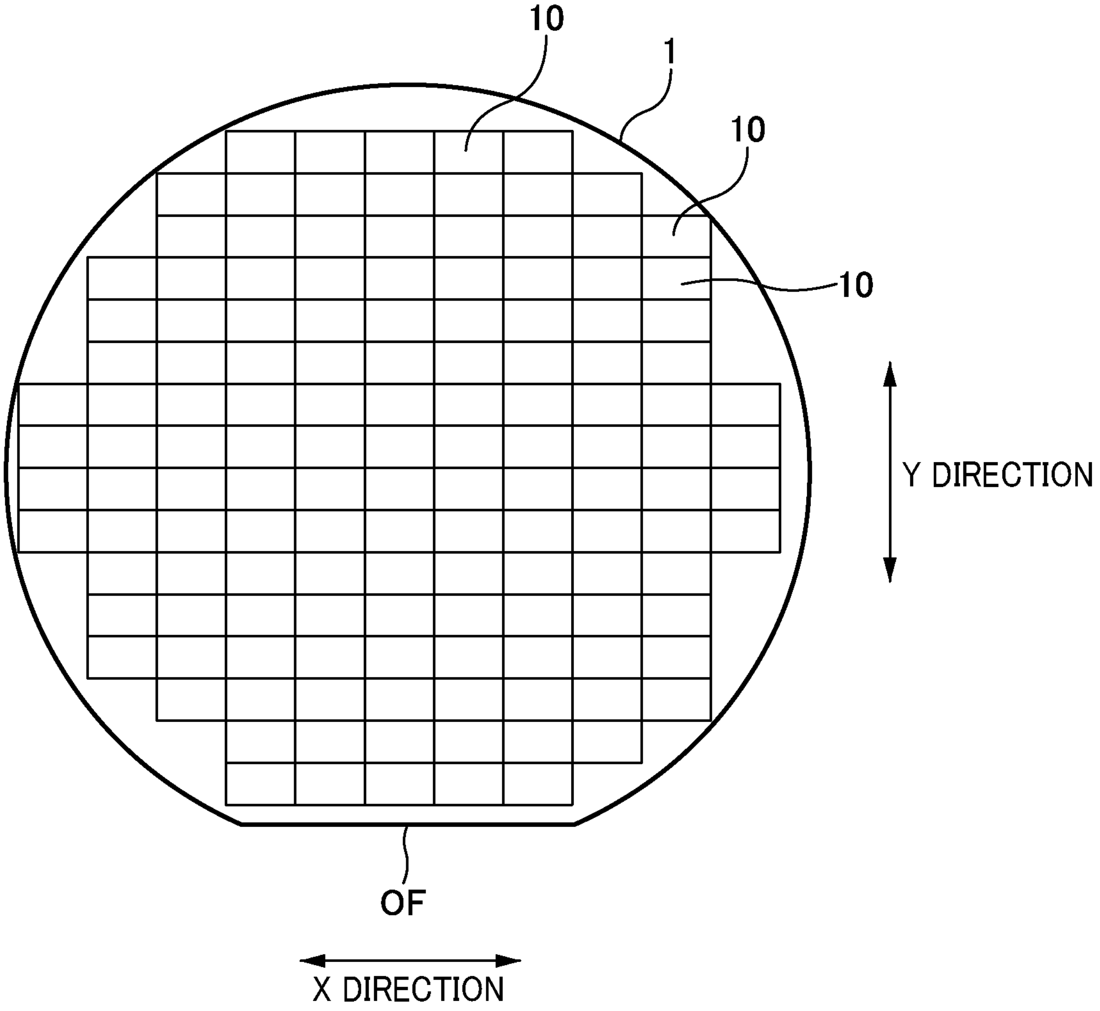
FIG. 1 PRIOR ART
FIG. 1 is a diagram illustrating an example of the relationship between a wafer 1 and semiconductor chips 10.

At least following matters will become apparent from the descriptions of the present description and the accompanying drawings.

The same or equivalent constituent elements, members, and the like illustrated in the drawings are given the same reference numerals, and repetitive description is omitted as appropriate.

In an embodiment of the present disclosure, the term "connect" refers to an electrically connected state unless otherwise specified. Thus, the term "connect" includes not only the case in which two components are connected through wiring, but also the case in which two components are connected through a resistor, for example.

First Embodiment

<<About Wafer and Semiconductor Chip>

FIG. 1 is a diagram illustrating an example of the relationship between a wafer 1 and semiconductor chips 10.

The wafer 1 is a thin plate member having a substantially disc shape, and has an orientation flat (hereinafter simply referred to as "orientation flat" or "OF") formed by linearly cutting part of the disc. Note that the present disclosure is not limited to the orientation flat being formed, and for example, a V-shaped notch may be formed by cutting part of the disc. Further, although the wafer 1 in an embodiment of the present disclosure is a SiC (silicon carbide) wafer, the present disclosure is not limited thereto, and may be formed of other materials (for example, silicon).

In the following, three directions intersecting one another are defined with respect to the wafer 1 (specifically, the wafer 1 during testing). The direction along the lateral direction of the paper in FIG. 1 (direction parallel to the OF) is defined as an X direction, and the direction along the vertical direction of the paper (direction perpendicular to the OF) is defined as a Y direction. In addition, the direction intersecting the X direction and the Y direction (the thickness direction of the wafer 1) is defined as a Z direction (also referred to as an up-down direction), and the front surface side of the wafer 1 is defined as "up" and the back surface side is defined as "down" (see FIGS. 2 and 3). FIG. 1 illustrates the front surface (upper surface) of the wafer 1.

As illustrated in FIG. 1, the wafer 1 has a plurality of semiconductor chips 10 formed side by side in the X and Y directions. Note that each of these multiple semiconductor chips 10 corresponds to a "semiconductor device". In the following description, the semiconductor chip 10 may be simply referred to as "chip".

The electrical characteristics of the multiple semiconductor chips 10 formed on the wafer 1 are measured, and then the chips are separated individually by dicing and sorted into non-defective products (normal products) and defective products (abnormal products) (details will be described later).

Figure 2A:
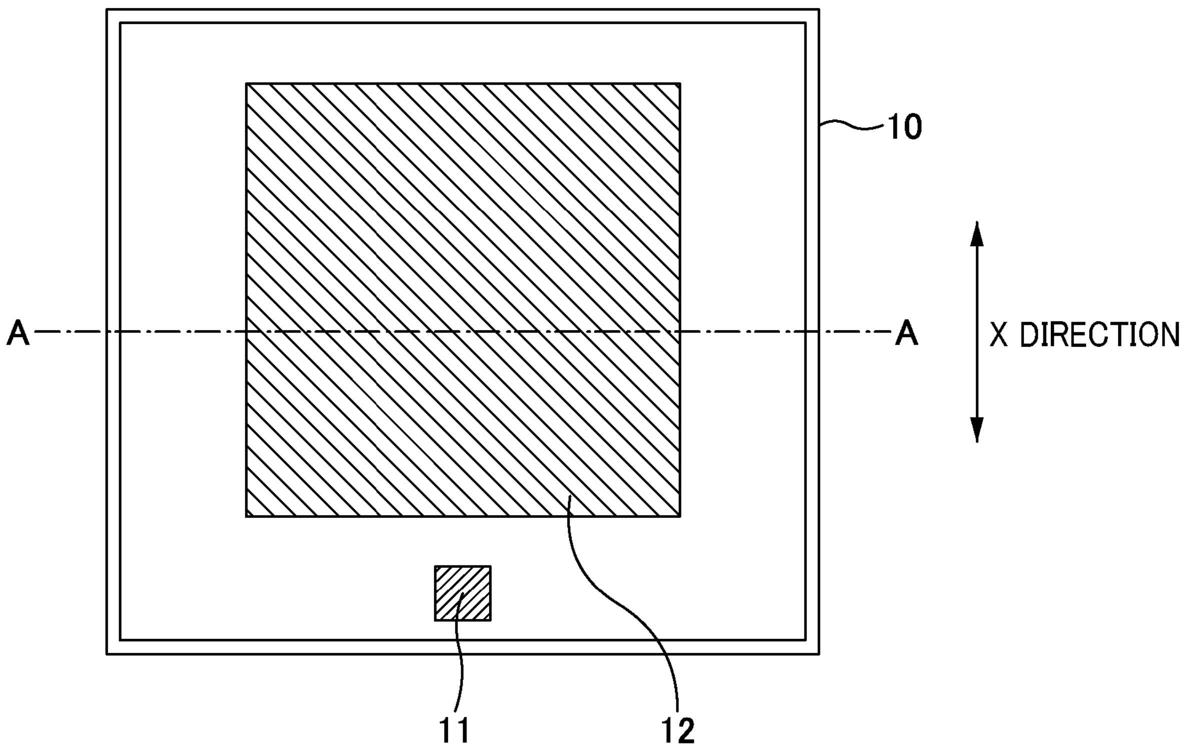
FIG. 2A PRIOR ART
FIGS. 2A and 2B are a plan view of a semiconductor chip 10, and a cross-sectional view taken along line A-A of the semiconductor chip 10, respectively.
Figure 2B:
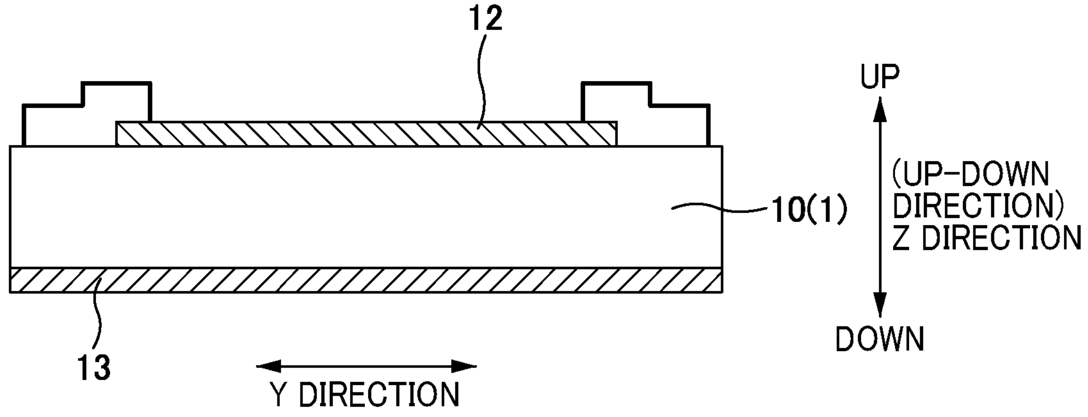
FIG. 2B PRIOR ART

FIGS. 2A and 2B are a plan view and a cross-sectional view of the semiconductor chip 10, respectively. FIG. 2B (cross-sectional view) illustrates a cross section taken along line A-A in the plan view. The relationship between the X- and Y-directions in FIGS. 2A and 2B may be reversed.

The semiconductor chip 10 according to an embodiment of the present disclosure is an MOSFET and has a gate electrode 11, a source electrode 12, and a drain electrode 13. Note that the semiconductor chip 10 is not limited to Metal-Oxide-Semiconductor-Field-Effect-Transistor (MOSFET), but can be insulated Gate Bipolar Transistor (IGBT), for example.

The drain electrode 13 is constituted by (formed of) a metal film at the back (bottom) surface of the semiconductor chip 10. Thus, when the wafer 1 is placed at a metal stage 30 (described later), the drain electrode 13 is electrically connected to the stage 30.

The gate electrode 11 and the source electrode 12 are formed so as to be exposed at the front (top) surface of the semiconductor chip 10. As illustrated in FIG. 2 (plan view), the gate electrode 11 and the source electrode 12 are aligned in the X direction, and the source electrode 12 is formed to have an area larger than the area of the gate electrode 11. Usually, multiple contact probes are placed in contact with the source electrode 12 during high-voltage testing, however, it is assumed, in an embodiment of the present disclosure, for simplicity, that a single contact probe (contact probe 42, 43, described later) is brought into contact with each of the gate electrode 11 and the source electrode 12.

Note that in the semiconductor chip 10, the gate electrode 11 corresponds to a "control electrode," the source electrode 12 (the emitter electrode in the case of an IGBT) corresponds to a "first main electrode" and a "predetermined electrode" and the drain electrode 13 (in the case of an IGBT, the collector electrode) corresponds to a "second main electrode.

<<About Testing System>>

Figure 3:
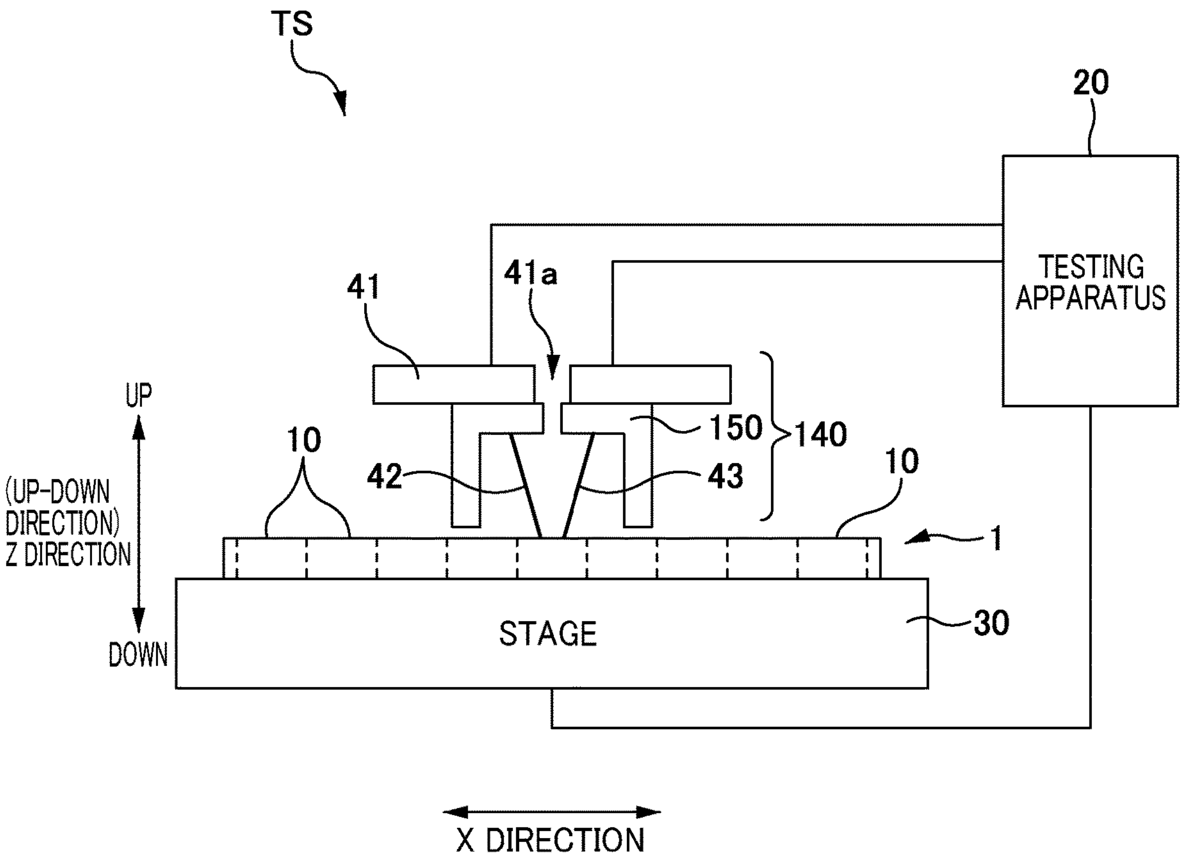
FIG. 3 PRIOR ART
FIG. 3 is a schematic diagram of a test system TS when testing a wafer 1.

FIG. 3 illustrates a schematic diagram of a test system TS when testing the wafer 1 (high-voltage testing).

The test system TS illustrated in FIG. 3 includes a testing apparatus 20, the stage 30, and a test jig 140. Note that the test jig 140 in FIG. 3 is a comparison example of an embodiment of the present disclosure.

<Testing Apparatus 20>

The testing apparatus 20 is an apparatus to conduct a test (here, a high-voltage testing), and includes a storage unit, a power supply unit, a processing unit, and the like (not illustrated).

The storage unit stores information about the wafer 1 and the semiconductor chips 10 (such as a map in FIG. 1, and information about the chip sizes in the X and Y directions), programs to conduct a test, and the like. Further, the storage unit also stores test results (measurement results) for chips.

The power supply unit supplies a power supply voltage used in the high-voltage testing. Specifically, the power supply unit applies a high voltage between the stage 30 and the contact probes 42 and 43 (described later).

The processing unit executes a program stored in the storage unit, for example, and sequentially tests each of the semiconductor chips 10 while controlling a test jig (here, the test jig 140). That is, the semiconductor chips 10 are sequentially measured in a predetermined order, based on the map in FIG. 1.

<Stage 30>

The stage 30 is a metal platform on which the wafer 1 is placed during testing, and is connected to the testing apparatus 20. The wafer 1 is placed on the stage 30 in a state in which the wafer 1 is aligned in the X and Y directions (for example, by using the orientation flat). Further, the stage 30 performs vacuum suction with respect to the wafer 1. This fixes the wafer 1 onto the stage 30 and also electrically connects the back surface of the wafer 1 (the drain electrode 13 of the semiconductor chip 10) and the stage 30.

<About Test Jig>

A comparison example is explained before describing the test jig in an embodiment of the present disclosure.

High-voltage semiconductor devices (chips) shrink in peripheral structure in association with design/process development, and the risk of discharge breakdown increases when high voltage is applied to chips adjacent to each other in wafer form, for example.

When testing in chip form, it is common to create a pressurized environment in a pressurized chamber that is sealed to such a degree as to cover the entire chip, to mitigate electrical discharge. However, when testing in wafer form, it is not easy to provide a chamber that covers the entire wafer due to such a problem as to need a large volume.

Thus, in the test jig 140 illustrated in FIG. 3, a small-sized (chip-scale) chamber (chamber 150) is provided under a probe card 41.

Comparison Example 1 (Test Jig 140)

The test jig 140 in FIG. 3 includes the probe card 41, the contact probes 42 and 43, and the chamber 150.

The probe card 41 is an instrument used for electrical testing of the semiconductor chips 10 formed on the wafer 1, and has a circular printed circuit board to which the contact probes 42 and 43 are precisely assembled. Note that the probe card 41 corresponds to a "substrate". As illustrated in FIG. 3, the probe card 41 is arranged (located) above the wafer 1 during testing of the semiconductor chip 10.

An opening 41*a* for air injection is formed to extend through the probe card 41 at the center thereof in the up-down direction. Air (compressed air) is supplied to this opening 41*a* from a gas supply unit not illustrated.

The contact probe 42, 43 is a measurement component (probe) for testing by bringing its tip into contact with an electrode at the front surface of the semiconductor chip 10, and corresponds to a "first probe". During testing, the contact probe 42, 43 is in contact with (is connected to) the gate electrode 11, the source electrode 12 of the semiconductor chip 10. Further, the contact probes 42 and 43 are connected to the probe card 41, and to the testing apparatus 20 through the probe card 41.

Note that in an embodiment of the present disclosure, a high-voltage testing refers to a static characteristic test such as leakage current measurement (for example, drain-source leakage current (Idss)) or withstand voltage measurement (for example, drain-source breakdown voltage (BVds)). In such high-voltage testing, a gate voltage Vgs of the gate electrode 11 is basically 0 V (GND potential), and a high voltage is applied between the drain electrode 13 and the source electrode 12, to thereby measure current and voltage. In general, when high voltage is to be applied, high voltage is applied to the drain electrode 13 (in other words, the stage 30) side.

The chamber 150 is provided on the lower side of the probe card 41 and is formed so as to surround the opening 41*a* of the probe card 41 and the contact probes 42 and 43. Further, the chamber 150 is a small chamber, and is provided to cover at least the semiconductor chip 10 to be tested out of those on the wafer 1.

Then, during testing (measurement), air is injected into the chamber 150 through the opening 41*a* of the probe card 41, to thereby pressurize the interior of the chamber 150. With the interior of the chamber 150 being pressurized as such, it is possible to suppress discharge breakdown of chip(s) adjacent to each other when high voltage is applied to the chip to be tested.

Note that an air gap (space) of about, for example, 100 μm is provided between the chamber 150 and the front (top) surface of the wafer 1. However, if the test is conducted continuously, the contact probes 42 and 43 are worn and deformed, which makes it difficult to maintain the air gap. Thus, the bottom (lower part) of the chamber 150 may contact the front surface of the wafer 1, which may scratch a wafer surface (front surface).

<Comparison Example 2 (Test Jig 240)

Figure 4:
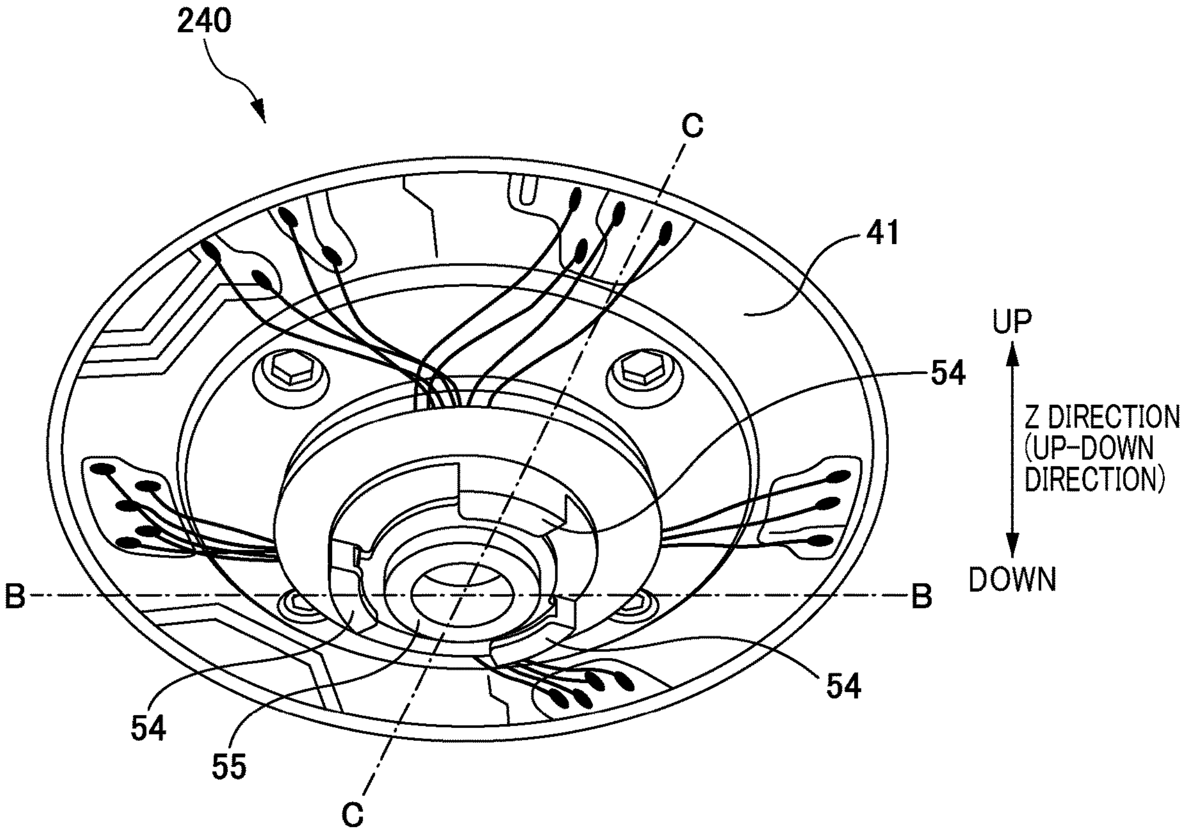
FIG. 4 PRIOR ART
FIG. 4 is a perspective view of a test jig 240 of a comparative example when viewed from below.
Figure 5A:
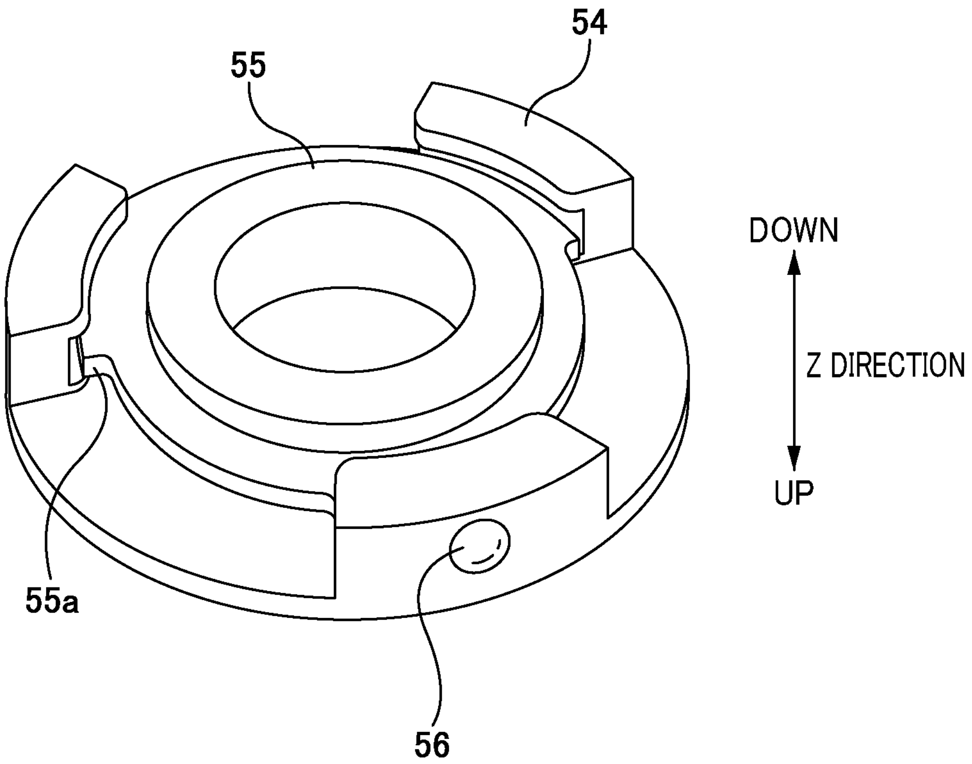
FIG. 5A PRIOR ART
FIGS. 5A and 5B are explanatory diagrams of the relationship between floating ring support parts 54 and a floating ring 55.
Figure 5B:
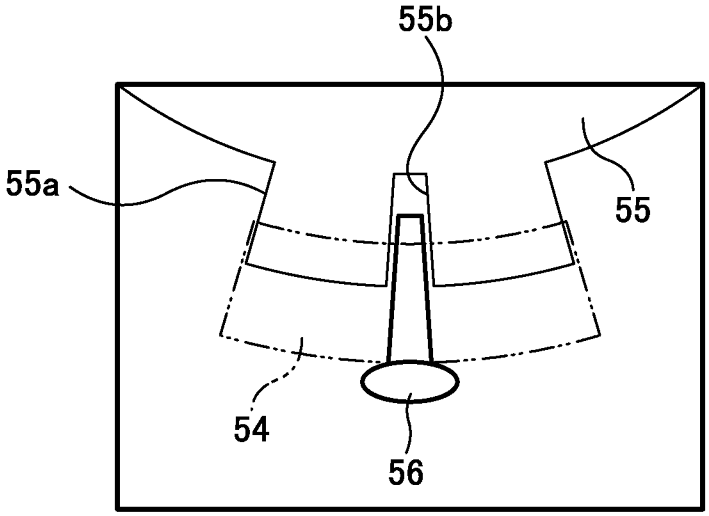
FIG. 5B PRIOR ART
Figure 6:
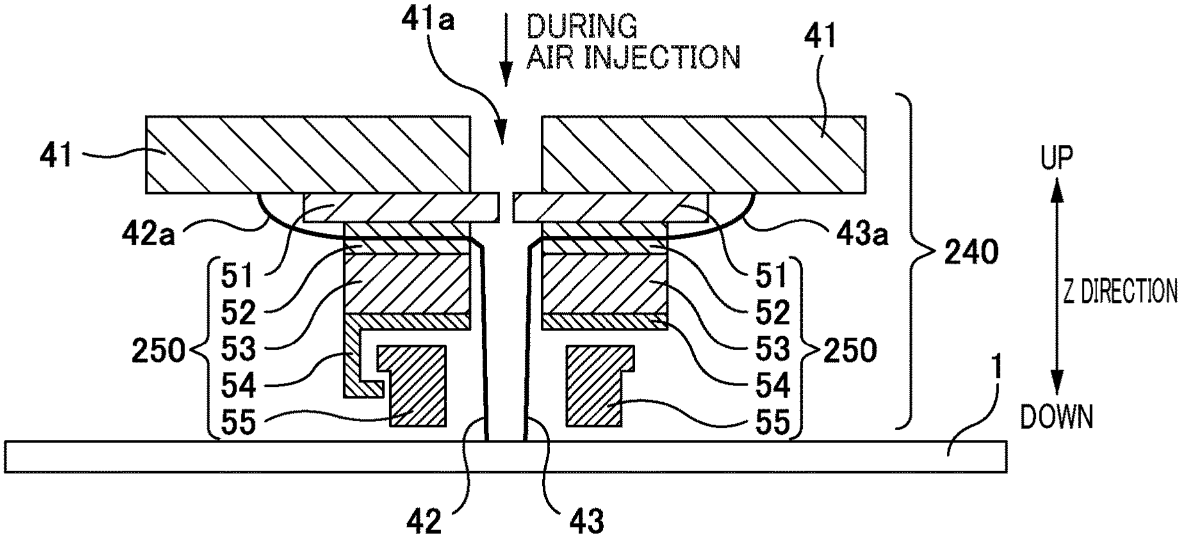
FIG. 6 PRIOR ART
FIG. 6 is a cross-sectional view taken along line B-B of FIG. 4.

FIGS. 4 to 7 are explanatory diagrams of a comparison example 2 of the test jig (test jig 240). FIG. 4 is a perspective view of the test jig 240 when viewed from below, with the contact probes 42 and 43 omitted for convenience. Further, FIGS. 5A and 5B are explanatory diagrams of the relationship between floating ring support parts 54 and a floating ring 55. Further, FIG. 6 is a cross-sectional view taken along line B-B of FIG. 4, and a cross-sectional view taken along line C-C of FIG. 4.

The test jig 240 includes the probe card 41, the contact probes 42 and 43, and a chamber 250.

Figure 7:
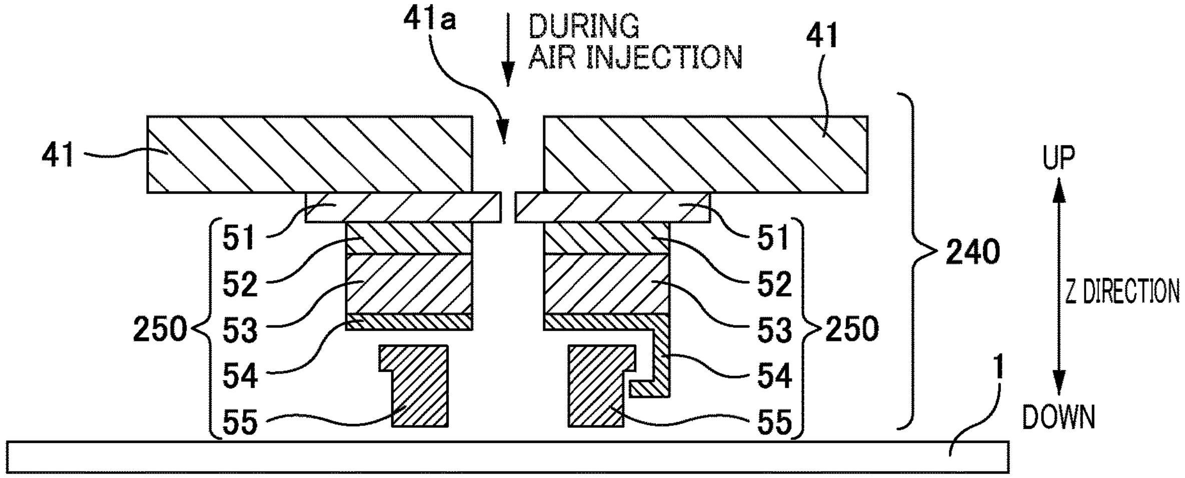
FIG. 7 PRIOR ART
FIG. 7 is a cross-sectional view taken along line C-C of FIG. 4.

The chamber 250, as with the chamber 150 in the comparison example 1, is provided on the lower side of the probe card 41 and is formed so as to surround the opening 41*a* of the probe card 41 and the contact probes 42 and 43. As illustrated in FIGS. 6 and 7, the chamber 250 includes a substrate connection part 51, an insulating layer 52, a relay member 53, the floating ring support parts 54, the floating ring 55, and a rotation stopper member 56.

The substrate connection part 51 is a connection part between the chamber (here, the chamber 250) and the probe card 41, and is made of metal or resin.

The insulating layer 52 is a layer formed of resin such as adhesive. Further, the wirings 42*a* and 43*a* are fixed to the insulating layer 52. Note that the wiring 42*a* is wiring to connect the probe card 41 and the probe 42, and the wiring 43*a* is wiring to connect the probe card 41 and the contact probe 43.

The relay member 53 is a member to secure the floating ring support parts 54 under the insulating layer 52. The relay member 53 is made of metal or resin. Note that the relay member 53 and the floating ring support parts 54 may be integrally formed.

The floating ring support parts 54 each has a part that sandwiches the floating ring 55 (specifically, the extending part 55*a*, described later in specific) in the Z-direction (up-down direction) with a space therebetween. The floating ring support parts 54 then supports the floating ring 55 so as not to fall, for example, before testing the semiconductor chip 10.

The floating ring 55 is a ring-shaped member made of resin, and is provided at the lower end part of the chamber 250, to surround the contact probes 42 and 43. Further, the floating ring 55 has extending parts 55*a* and a groove part 55*b* as illustrated in FIG. 5B.

The extending parts 55*a* are provided to extend outward at the upper end of the floating ring 55. Further, the extending parts 55*a* are provided at three locations with a space between each two thereof at the periphery of the floating ring 55. As described above, when the floating ring 55 is not floating, such as before testing, these extending parts 55*a* (in other words, the floating ring 55) is supported by the floating ring support parts 54.

The groove part 55*b* is a groove that is formed to circumferentially align the floating ring 55 and the floating ring support parts 54, and is formed such that the extending part 55*a* is cut out along the Z direction (up-down direction). Note that in an embodiment of the present disclosure, one of the three extending parts 55*a* has the groove part 55*b*.

The rotation stopper member 56 is a member to prevent rotation (rotation around an axis extending along the Z direction) of the floating ring 55 with respect to the floating ring support part 54, and is, for example, a screw, pin, or the like. The rotation stopper member 56 is attached to the sidewall of the floating ring support part 54 and the tip thereof is inserted into the groove part 55*b* that is formed in the extending part 55*a* of the floating ring 55. This prohibits the floating ring 55 from rotating with respect to the floating ring support parts 54, while allowing it to be movable in the Z direction (up-down direction).

During testing, air is injected into the chamber 250 through the opening 41*a* of the probe card 41. This allows the floating ring 55 to rise (float upward) from the state of being supported by the floating ring support parts 54, thereby being able to maintain the distance from the wafer 1 (see FIGS. 6 and 7).

However, in the comparison example 2, it is needed to control and monitor the flow rate of the air supplied into the chamber 250, and if the injection of the air is stopped (or the injection volume decreases) for some reason, the floating ring 55 may fall (lower) and contact the wafer 1 (scratch the surface of the wafer 1).

Accordingly, the test jig 40 in an embodiment of the present disclosure is configured to keep the wafer surface from being scratched even if air injection is stopped (or the injection volume decreases).

<Test Jig 40 According to First Embodiment>

Figure 8:
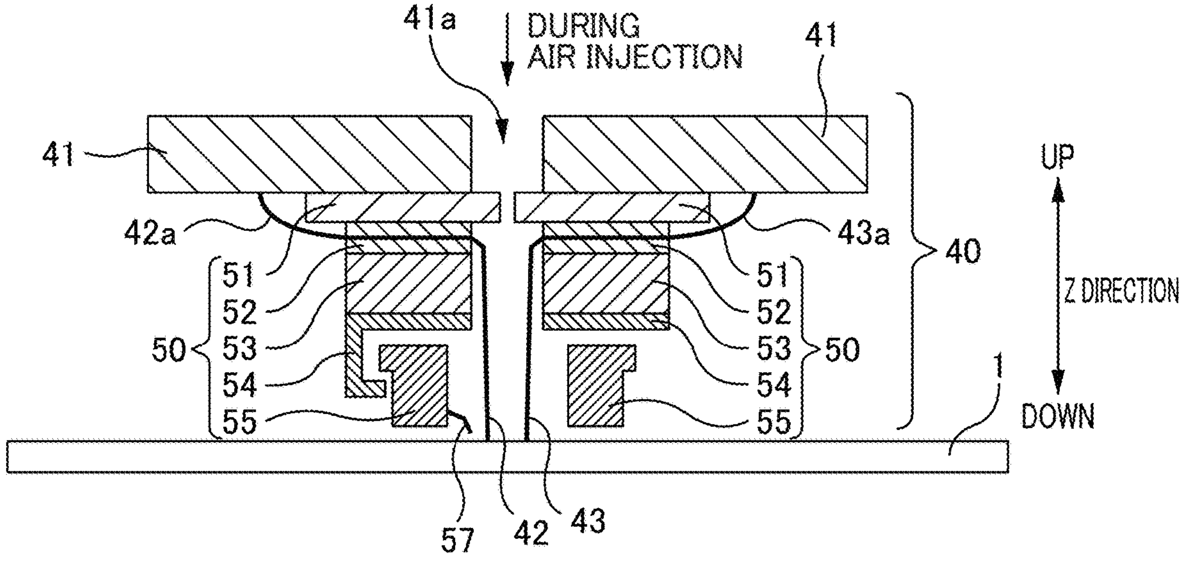
FIG. 8 is a schematic explanatory diagram of a test jig 40 according to a first embodiment.
Figure 9:
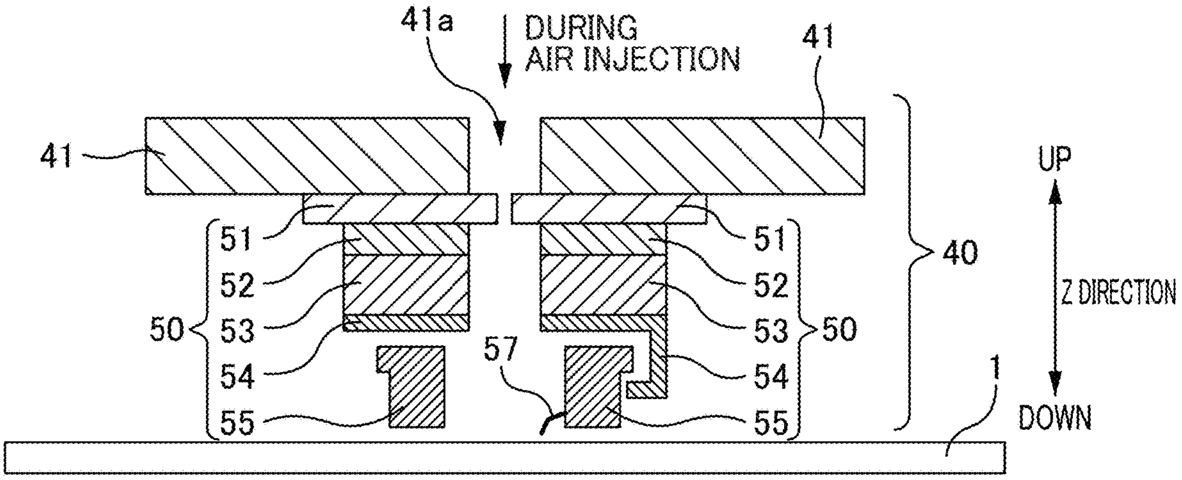
FIG. 9 is a schematic explanatory diagram of a test jig 40 according to a first embodiment.

FIGS. 8 and 9 are schematic explanatory diagrams of the test jig 40 according to a first embodiment. Note that FIG. 8 is a cross-sectional view corresponding to FIG. 6, and FIG. 9 is a cross-sectional view corresponding to FIG. 7.

The test jig 40 according to an embodiment of the present disclosure includes the probe card 41, the contact probes 42 and 43, and a chamber 50. Further, the chamber 50 includes a substrate connection part 51, the insulating layer 52, the relay member 53, the floating ring support parts 54, the floating ring 55, the rotation stopper member 56, and a position holding probe 57.

The position holding probe 57 is a member to restrain the floating ring 55 from lowering such that the floating ring 55 does not contact the wafer 1. The position holding probe 57 is provided at the lower part of the floating ring 55, and the tip of the position holding probe 57 is located below the lower end of the floating ring 55. Further, when testing, the tip of the position holding probe 57 is located at the source electrode 12 of the semiconductor chip 10 in plan view when seen from above. Note that the material of the position holding probe 57 is the same as that of the contact probes 42 and 43.

In the chamber 50 according to an embodiment of the present disclosure, the floating ring support part 54 corresponds to a "support part", the floating ring 55 corresponds to a "surrounding member," and the position holding probe 57 corresponds to a "restraining member" and a "second probe".

With the provision of the position holding probe 57, even if air injection stops (or the injection volume decreases) during testing, the distance between the floating ring 55 and the wafer 1 is maintained by virtue of the contact between the position holding probe 57 and the semiconductor chip 10. This can keep the surface of wafer 1 from being scratched. Further, in this case, the position holding probe 57 contacts the electrode (the source electrode 12) of the semiconductor chip 10, and the floating ring 55 is movable up and down. Thus, the scratch by the position holding probe 57 is smaller (less noticeable) than the scratches by the contact probes 42 and 43.

<<About Manufacturing Process of Semiconductor Chip 10>>

Figure 10:
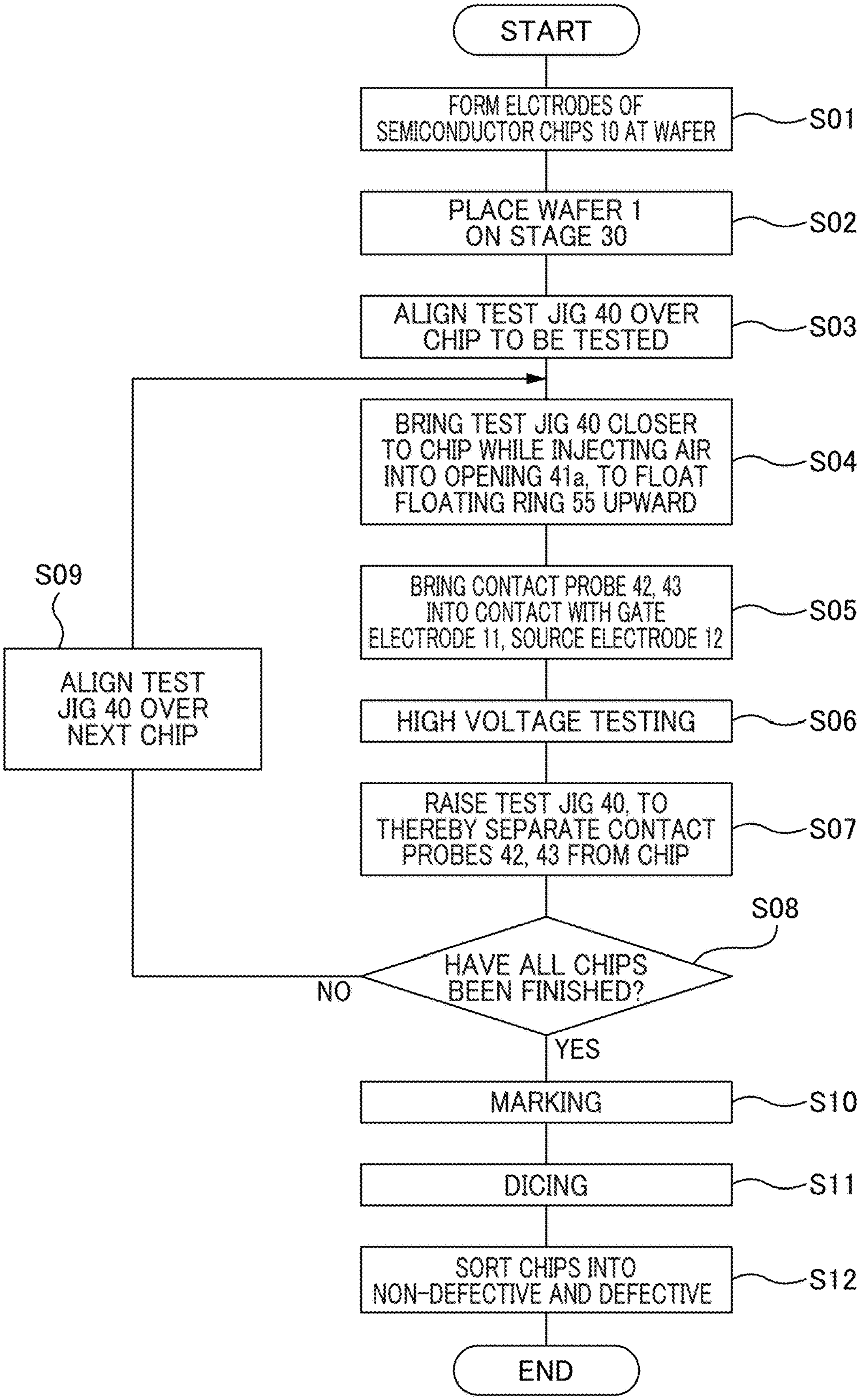
FIG. 10 is a flow diagram illustrating a method of manufacturing a semiconductor chip 10.

FIG. 10 is a flow diagram to illustrate a method of manufacturing the semiconductor chip 10. Note that the flow in FIG. 10 also includes a method of testing the semiconductor chip 10 as well.

First, the plurality of semiconductor chips 10 (MOSFETs) are formed on the wafer 1, and the electrodes of the semiconductor chips 10 are formed (S01). Specifically, the drain electrode 13 is formed at the back surface of the wafer 1 (the semiconductor chip 10), and the gate electrode 11 and the source electrode 12 are formed at the front surface thereof.

Next, the wafer 1 on which the plurality of semiconductor chips 10 are formed is placed on the stage 30 (S02). This connects the drain electrode 13 of each of the semiconductor chips 10 to the testing apparatus 20 through the stage 30.

The testing apparatus 20 executes a program stored in the storage unit and moves the test jig 40 onto the semiconductor chip 10 to be tested (hereinafter also referred to as chip under test) (S03).

Next, the testing apparatus 20 lowers the test jig 40 and brings it closer to the chip under test, while injecting air into the chamber 50 through the opening 41*a* of the probe card 41 (S04).

In this event, with air being injected into the chamber 50, the floating ring 55 floats upward. This maintains the distance between the floating ring 55 and the wafer 1, thereby being able to keep the wafer surface from being scratched. Further, even if the air injection stops (or the injection volume decreases), the distance between the floating ring 55 and the wafer 1 is maintained because the position-holding probe 57 contacts the electrode (the source electrode 12) of the chip under test.

Furthermore, by lowering the test jig 40, the contact probe 42, 43 is brought into contact with the gate electrode 11, the source electrode 12 of the chip under test (S05).

The testing apparatus 20 then applies a high voltage between the stage 30 and the contact probes 42, 43 to perform a high voltage electrical testing (S06). In this event, the interior of the chamber 50 is pressurized with air, thereby being able to prevent discharge breakdown between chips adjacent to each other.

Note that the timing at which the floating ring 55 floats may be after the position holding probe 57 contacts the chip under test. In this case as well, where scratches are made is on the electrode (the source electrode 12) of the chip under test, and since the floating ring 55 is movable up and down, the scratches by the position-holding probes 57 are much smaller than those by the contact probes 42 and 43 are.

When the test of the chip under test ends, the testing apparatus 20 moves (raises) the test jig 40 upward, to thereby separate the contact probes 42 and 43 from the chip under test (S07). In this event, the injection of air into the chamber 50 may be stopped, or air may remain injected. Note that the floating ring 55 is supported by the floating ring support parts 54.

When all the chips have not been tested (NO in S08), the testing apparatus 20 moves the test jig 40 over the next chip under test (S09). Then, the next chip under test is tested in the same manner. Note that the data of the chip tested will be stored in the storage unit of the testing apparatus 20.

When all the chips have been tested (YES in S08), then, based on the test results stored in the testing apparatus 20, marking is provided to the semiconductor chip 10 that has been determined to be defective, using a dedicated marking device (not illustrated), for example (S10). The type of marking is not particularly limited, and may be marking using ink or a laser, for example.

Thereafter, the wafer 1 is diced and separated (divided) into individual semiconductor chips 10 (S11). Then, based on the presence or absence of the marking, products are sorted into non-defective (normal) products and defective (abnormal) products (S12). Defective products are removed and only non-defective products proceed to the next process (such as semiconductor module integration).

As described above, the test jig 40 according to an embodiment of the present disclosure includes the chamber 50 on the lower side of the probe card 41. The chamber 50 also includes the floating ring 55, the floating ring support parts 54, and the position-holding probe 57. A position-holding probe 57 is provided to the floating ring 55 to suppress lowering of the floating ring 55 when the injection of air into the opening 41*a* is stopped during testing.

This keeps the floating ring 55 from contacting the wafer 1, thereby being able to suppress damage to the surface (front surface) of the wafer 1.

Second Embodiment

Figure 11:
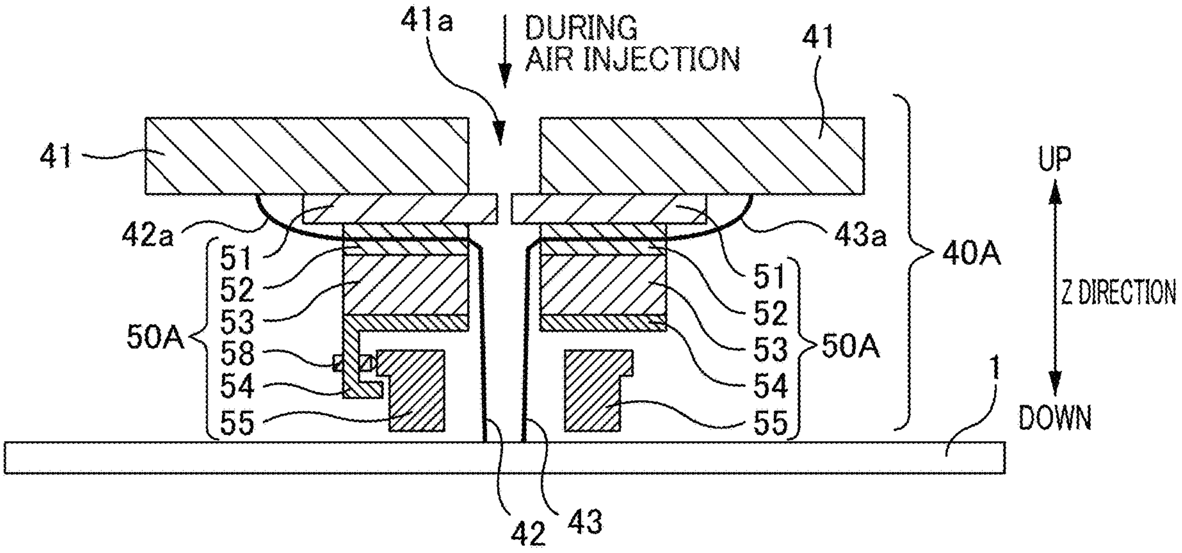
FIG. 11 is a schematic explanatory diagram of a test jig 40A according to a second embodiment.
Figure 12:
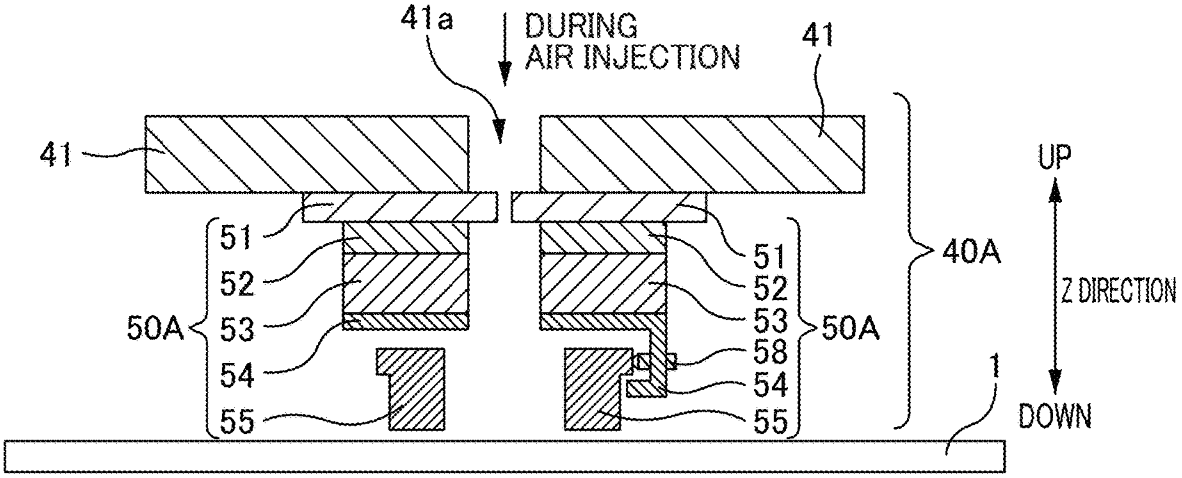
FIG. 12 is a schematic explanatory diagram of a test jig 40A according to a second embodiment.

FIGS. 11 and 12 are schematic explanatory diagrams of a test jig 40A according to a second embodiment. Note that FIG. 11 is a cross-sectional view corresponding to FIG. 6, and FIG. 12 is a cross-sectional view corresponding to FIG. 7.

The test jig 40A of the second embodiment includes the probe card 41, the contact probes 42 and 43, and a chamber 50A. Further, the chamber 50A includes the substrate connection part 51, the insulating layer 52, the relay member 53, the floating ring support parts 54, the floating ring 55, and a ball plunger 58. Note that in the second embodiment, the ball plunger 58 corresponds to the "restraining member" and a "plunger".

The ball plunger 58 is a member to hold the position of the floating ring 55 in the up-down direction, and is attached to the side part of the floating ring support parts 54. Further, the ball plunger 58 is provided in place of the rotation stopper member 56 of the first embodiment (inserted into the groove part 55*b*), and also has a function of preventing rotation of the floating ring 55 relative to the floating ring support parts 54. Note that in the first embodiment, the rotation stopper member 56 is provided to one of the three extending parts 55*a* of the floating ring 55, whereas in the second embodiment, the ball plunger 58 is provided to each of the three extending parts 55*a* (three groove parts 55*b*) of the floating ring 55 (that is, three ball plungers 58 are provided).

Figure 13A:
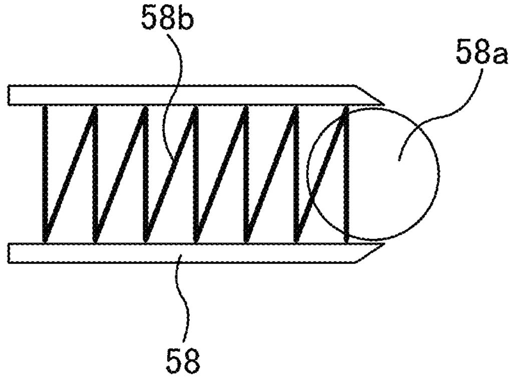
FIG. 13A is an explanatory diagram illustrating an example of a ball plunger 58.
Figure 13B:
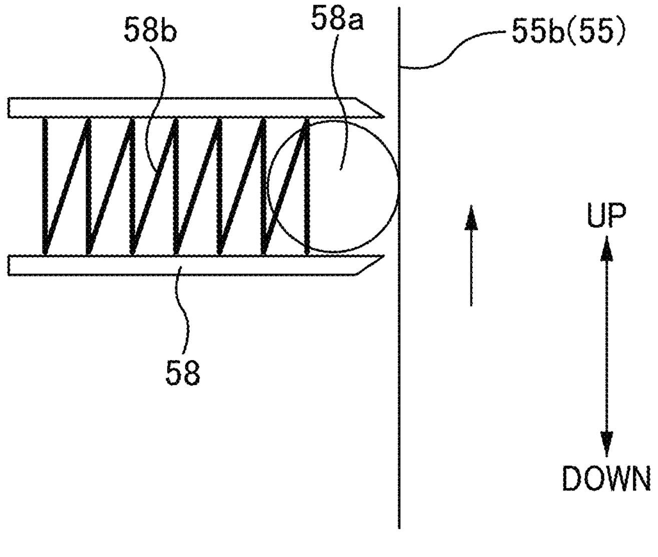
FIG. 13B is a diagram illustrating a state in which a ball plunger 58 presses against a floating ring 55 when the floating ring 55 floats.

FIG. 13A is an explanatory diagram illustrating an example of the ball plunger 58. FIG. 13B is a diagram illustrating how the ball plunger 58 presses against the floating ring 55 when the floating ring 55 floats.

As illustrated in FIG. 13A, the ball plunger 58 has a ball 58*a* and a spring 58*b*.

The ball 58*a* is a spherical body made of metal or plastic, and is provided at the tip of the ball plunger 58.

The spring 58*b* is an elastic member (spring) provided in the inner side of the ball plunger 58, and presses the ball 58*a* forward.

With the above configuration, when air is injected into opening 41*a* and the floating ring 55 rises (floats), the ball plunger 58 presses the ball 58*a* against the groove part 55*b* of the floating ring 55 by virtue of the spring pressure (elastic force) of the spring 58*b*, thereby maintaining the height of the floating ring 55 (see FIG. 13B).

Thus, when the injection of air into the opening 41*a* is stopped during testing, the ball plunger 58 prevents the floating ring 55 from lowering, thereby being able to prevent contact between the floating 1 ring 55 and the wafer (preventing damage to the wafer 1).

Note that in an embodiment of the present disclosure, the ball plunger 58 is used, but the present disclosure is not limited thereto. For example, a plunger having a pin at its tip (pin plunger) may be used.

Summary

The test jig 40 and the like according to an embodiment of the present disclosure have been described above. The test jig 40 is a jig to test each semiconductor chip of a plurality of semiconductor chips 10 formed on the wafer 1, and the test jig 40 includes the probe card 41 having the opening 41*a*, the chamber 50, and the contact probe 42, 43 for measuring the semiconductor chip 10. Further, the chamber 50 includes the floating ring 55, the floating ring support part 54, and the position holding probe 57. The floating ring 55 surrounds the contact probe 42, 43, and is configured to float upward in response to air being injected from the opening 41*a*, during the testing of the semiconductor chip 10. The floating ring supporting part 54 supports the floating ring 55 before the testing. The position-holding probe 57 is configured to restrain the floating ring 55 from lowering such that the surrounding member does not contact the wafer 1 when the injection of air into the opening 41*a* is stopped, during testing.

As a result, even if the injection of air into the opening 41*a* is stopped, it is possible to keep the surface (front surface) of the wafer 1 from being scratched, because the floating ring 55 does not contact the wafer 1.

Further, the position-holding probe 57 is provided to the floating ring 55, and the tip of the position-holding probe 57 is positioned below the lower end of the floating ring 55.

This can restrain the floating ring 55 from contacting the surface of the wafer 1, thereby being able to keep the surface of the wafer 1 from being scratched.

Further, the source electrode 12 is formed at the front surface of the semiconductor chip 10, and the tip of the position-holding probe 57 is positioned at the source electrode 12 in a plan view of the semiconductor chip 10 when viewed from above, during testing.

This makes it possible to prevent damage to parts other than the electrode (source electrode 12) of the semiconductor chip 10.

Further, the floating ring 55 floats upward after the tip of the position-holding probe 57 contacts the source electrode 12 of the semiconductor chip 10.

Accordingly, even if the position-holding probe 57 contacts the source electrode 12 of the semiconductor chip 10, the source electrode 12 is less likely to be scratched (and scratches are less noticeable).

Further, the testing jig 40A of the second embodiment includes the chamber 50A. The ball plunger 58 is attached to the floating ring support part 54 of the chamber 50A.

This allows the ball plunger 58 to hold the position of the floating ring 55 in the up-down position when the floating ring 55 floats, thereby being able to restrain the floating ring 55 from lowering.

Further, the method of testing the semiconductor chip 10 in an embodiment of the present disclosure is a testing method of performing testing using the testing jig 40 described above, the method includes steps from step S02 to step S08 in FIG. 10.

This makes it possible to keep the surface (front surface) of the wafer 1 from being scratched when testing the semiconductor chip 10.

Further, the method of manufacturing the semiconductor chip 10 in an embodiment of the present disclosure includes steps from step S01 to step S12 in FIG. 10.

This makes it possible to keep the surface of the wafer 1 (semiconductor chip 10) from being scratched.

The present disclosure is directed to provision of a test jig capable of keeping a wafer from being scratched.

According to the present disclosure, it is possible to provide a test jig capable of keeping a wafer from being scratched.

OTHER EMBODIMENTS

An embodiment of the present disclosure described above is simply to facilitate understanding of the present disclosure and is not in any way to be construed as limiting the present disclosure. The present disclosure may variously be changed or altered without departing from its essential features and encompass equivalents thereof.

What is claimed is:

1. A test jig for testing each semiconductor device of a plurality of semiconductor devices formed on a wafer that is placed under the test jig during the testing, the test jig comprising:

a substrate having an opening extending therethrough in an up-down direction, so as to allow air to be injected from the opening in a thickness direction of the wafer during the testing;

a chamber formed to surround the opening, and positioned lower than the substrate; and first probe for measuring said each semiconductor device, the first probe being connected to the substrate, wherein the chamber includes:

a surrounding member that surrounds the first probe, the surrounding member being configured to float upward in response to the injection of the air from the opening during the testing;

a support part configured to support the surrounding member, the support part supporting the surrounding member before the surrounding member floats upward during the testing; and a restraining member configured to restrain the surrounding member from lowering such that the surrounding member does not contact the wafer after the injection of the air is stopped during the testing.

2. The test jig according to claim 1, wherein the restraining member constitutes a second probe of the test jig and is connected to the surrounding member, and a tip of the second probe is positioned below a lowest end of the surrounding member.

3. The test jig according to claim 2, wherein said each semiconductor device has a predetermined electrode formed at a front surface thereof, and the tip of the second probe is positioned at the predetermined electrode in a plan view of the wafer during the testing.

4. The test jig according to claim 3, wherein the surrounding member floats upward after the tip of the second probe contacts the predetermined electrode.

5. The test jig according to claim 1, wherein the restraining member is a plunger attached to the support part.

6. A testing method for testing one of a plurality of semiconductor devices using the test jig according to claim 1, the one semiconductor device having a front surface at which a control electrode and a first main electrode are formed, and a back surface at which a second main electrode is formed, the test jig further including another one of the first probe, the testing method comprising:

placing the wafer on a stage;

aligning the test jig over the one semiconductor device;

bringing the test jig to the one semiconductor device and floating the surrounding member while injecting the air into the opening of the test jig;

bringing the two first probes into contact with the control electrode and the first main electrode of the one semiconductor device, respectively;

applying a voltage between the first probes and the stage, to measure characteristics of the one semiconductor device; and moving the test jig upward to thereby separate the first probes from the one semiconductor device.

7. A method of manufacturing a plurality of semiconductor devices, the method comprising:

obtaining a wafer having the plurality of semiconductor devices formed thereon;

forming, on the wafer, a control electrode, a first main electrode, and a second main electrode for each of the plurality of semiconductor devices;

performing the testing of each of the plurality of semiconductor devices by the testing method according to claim 6;

providing marking to any of the plurality of semiconductor devices that has been determined to be defective by the testing;

dicing the wafer; and determining whether each of the plurality of semiconductor devices is a non-defective product or a defective product, based on presence or absence of the marking.

* * * * *